United States Patent [19]

Juri et al.

[11] Patent Number: 5,166,684
[45] Date of Patent: Nov. 24, 1992

[54] VARIABLE LENGTH ENCODER HAVING SIGN BIT SEPARATION

[75] Inventors: Tatsuro Juri, Osaka; Masakazu Nishino, Kashiwara; Hideki Otaka, Neyagawa, all of Japan

[73] Assignee: Matsushita Electric Industrial Co, Ltd., Osaka, Japan

[21] Appl. No.: 794,216

[22] Filed: Nov. 19, 1991

[30] Foreign Application Priority Data

Nov. 20, 1990 [JP] Japan ................................ 2-317230

[51] Int. Cl.⁵ .............................................. H03M 7/40
[52] U.S. Cl. ............................................ 341/67; 341/50
[58] Field of Search ............................ 341/50, 58, 67

[56] References Cited

U.S. PATENT DOCUMENTS

| | | | |
|---|---|---|---|
| 4,568,916 | 2/1986 | Bahgat | 341/67 |
| 4,675,650 | 6/1987 | Coppersmith et al. | 341/58 |
| 4,901,075 | 2/1990 | Vogel | 341/63 |

Primary Examiner—Marc Hoff
Attorney, Agent, or Firm—Wenderoth, Lind & Ponack

[57] ABSTRACT

A variable length code encoder is provided in which, during variable length code encoding of video or audio data which has been divided into blocks for ease of transmission or storage, the lowest bit of a particular variable length code in each block of code words which is composed of a special pattern of bits and arranged to appear at no other position than the end of the block, is utilized for carrying a piece of data in addition to the data of the block.

6 Claims, 2 Drawing Sheets

VARIABLE LENGTH ENCODER HAVING SIGN BIT SEPARATION

BACKGROUND OF THE INVENTION

1. Field of the Invention

The present invention relates to a high-efficiency encoder for use in transmission and/or recording of audio or video data.

2. Description of the Prior Art

It is known that video data which contains a large volume of information is high-efficiency encoded to a low-bit code form for ease of transmission or storage. The high-efficiency encoding involves compression of video or audio data through removing its redundant components. In common, a block encoding technique is best employed in which a sampled data input is divided into blocks and each block which contains a plurality of consecutive sample values is orthogonally transformed and compressed.

The orthogonal transformation is generally carried out by a discrete cosine transformation technique (abbreviated to as DCT technique hereinafter). It is also known that a method of orthogonal data, produced through the DCT technique, being quantized and encoded into variable length codes for transmission is most appropriate for use in the high-efficiency encoding. The variable length code encoding employs a two-dimensional variable length code encoding technique in which quantized data of each block are translated into low-bit code forms through on detection of a quantized value representing zero, both the number of zeros and the amplitude of non-zeros following the zeros are encoded simultaneously. Also, the lowest bit of each code word encoded by the variable length code encoding is commonly assigned to a sign bit denoting whether the value of the cord word is positive or negative.

The disadvantage of the variable length code encoding is such that if any error bit exists, the synchronism of code word blocks may be interrupted, thus causing decoding errors. Hence, a technique is used in which a particular string of bits is allocated to the end of each block so that it appears at no other locations throughout the succession of code words in the block. In operation, whenever the synchronism of code word blocks is disturbed, the end of each block is systematically identified by detecting the particular bit string and thus, the code synchronism can be restored.

Table 1 illustrates an example of code words in which the two-dimensional vector form of an input signal represents at right half the number of consecutive zeros and at left half the absolute value of the number of non-zeros following the zeros. More specifically, the vector (2, 1) indicates that two consecutive quantized values are 0 and followed by other quantized values whose absolute value is 1. Also, the EOB (end of block) is arranged to be replaced with the remaining quantized values, which all are zero, of the DCT block. In other words, EOB is a sign word denoting the end of a block. The lowest bit s of each code word is a sign bit denoting whether the amplitude of quantized values after a zero bit is positive or negative. In common, if it is positive, the sign bit is expressed as "0" and if negative, as 1".

TABLE 1

| Input signal | Code word |
| --- | --- |
| (0, 1) | 1 0 s |

TABLE 1-continued

| Input signal | Code word |
| --- | --- |
| (0, 2) | 1 1 0 s |
| (1, 1) | 0 0 1 s |
| (2, 1) | 0 1 1 0 s |
| (3, 1) | 0 1 1 1 0 s |
| (4, 1) | 0 1 1 1 1 0 s |
| E O B | 1 1 1 1 0 s |

As shown in Table 1, the string of six bits, 11110s, is arranged to appear at no location other than the end of a given series of code words in a block. If the code synchronism is disturbed by a transmission error, 11110s is first detected. The succeeding bit after 11110s is always the most significant bit (MSB) of a code word in the next block and thus, the code synchronism can be restored. EOB is the sign word of each DCT block and when expressed by 11110s as shown in Table 1, can permit the code synchronism to be restored with more certainty.

However, the EOB in Table 1 which contains the sign bit s at end, is substantially designated to associate with neither a positive nor a negative sign. More specifically, the EOB contains one unnecessary bit which tends to reduce the effectiveness in high-efficiency encoding. Also, if the least significant bit (LSB) s of the EOB is omitted, the restoring of code synchronism by the detection of EOB will hardly be conducted.

It is thus an object of the present invention to overcome the foregoing drawback of a known variable length encoder.

SUMMARY OF THE INVENTION

A variable length encoder according to the present invention incorporates a code separating means for separating a sign bit, which denotes whether a value of an input signal is positive or negative, from an input signal during a process in which video or audio data is divided into blocks and data of each block is converted into a variable length code form for transmission and/or storage. In particular, the sign bit separated by said code separating means is assigned to the lowest bit of a particular code word having a special bit pattern which does not appear at any other position than the end of each block, so that one lowest bit of the particular code word, or an end-of-block (EOB) code word, can carry a piece of data in addition to the data of code words in the block.

DESCRIPTION OF THE PREFERRED EMBODIMENTS

Preferred embodiments of the present invention will be described referring to the accompanying drawings.

Figure 1:
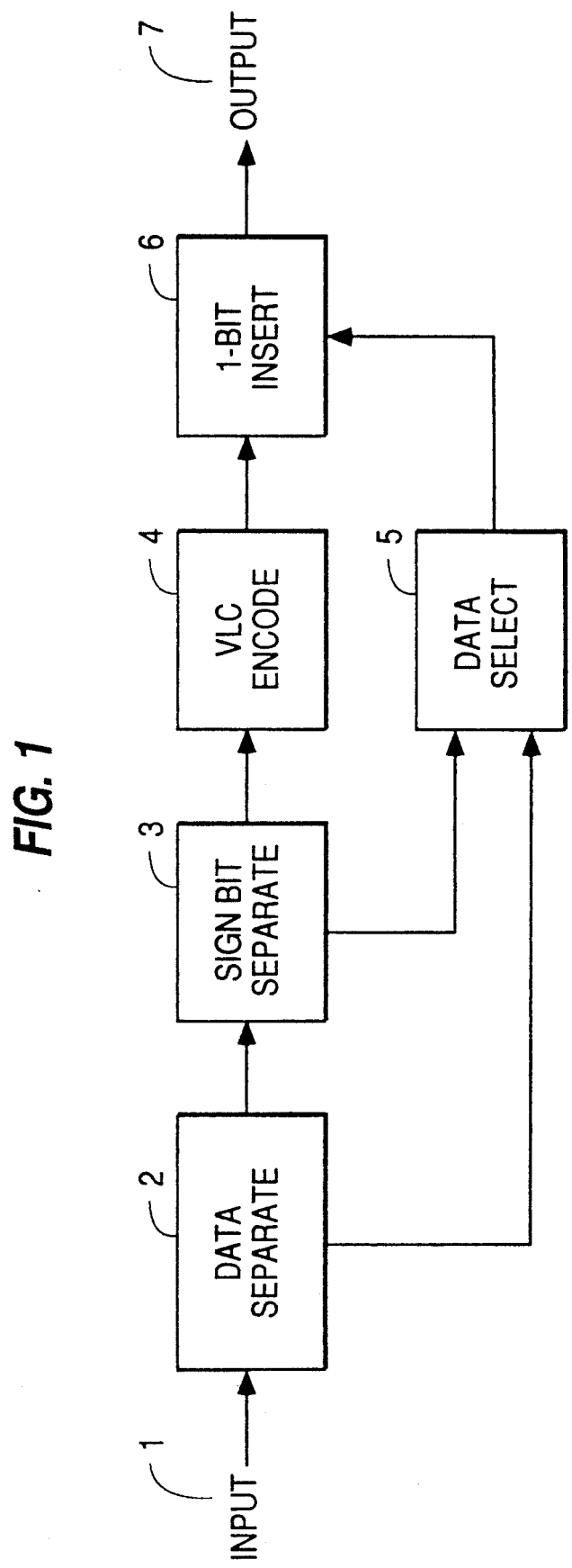
FIG. 1 is a block diagram showing a first embodiment of the present invention.

FIG. 1 is a block diagram showing a first embodiment of the present invention. Illustrated in FIG. 1 are a data input terminal 1 for receipt of e.g. quantized values, a data separator unit 2 for separating a desired data to be encoded into a variable length code form from the other component, a sign bit separator unit 3 for separating a sign bit which denotes whether the quantized values are positive or negative, a variable length code encoding (abbreviated as VLC) unit 4, a data selector unit 5, a one-bit insertion unit 6, and a data output terminal 7.

The operation of the first embodiment shown in FIG. 1 is explained as follows. Quantized data fed from the input terminal 1 are divided by the data separator 2 into quantized values to be VLC encoded and data components to be inserted into EOBs. The quantized values separated at the data separator 2 are then divided by the sign bit separator 3 into absolute values and sign bits for determining the value direction. The absolute values are converted by the VLC unit 4 into variable length code forms. The data selector 5 upon detecting that the data output from the VLC unit 4 is an EOB, transmits a data component to be inserted into the EOB from the data separator 2 to the one-bit insertion unit 6. If the data output from the VLC unit 4 is a VLC word containing a set of quantized values, the data selector 5 transmits a sign bit corresponding to the quantized values from the sign bit separator 3 to the one-bit inserting unit 6. The one-bit inserting unit 6 assigns one bit selected by the data selector 5 to the lowest bit of each code word fed from the VLC unit 4 and delivers a combined data to the output terminal 7. If the code word from the VLC unit 4 contains particular quantized values (e.g. 0) associated with no sign bit and is not an EOB, it will directly be transferred without insertion of a bit. In this manner, the lowest bit of an EOB can carry any desired piece of data in addition to the quantized values of the block, as being best utilized.

Figure 2:
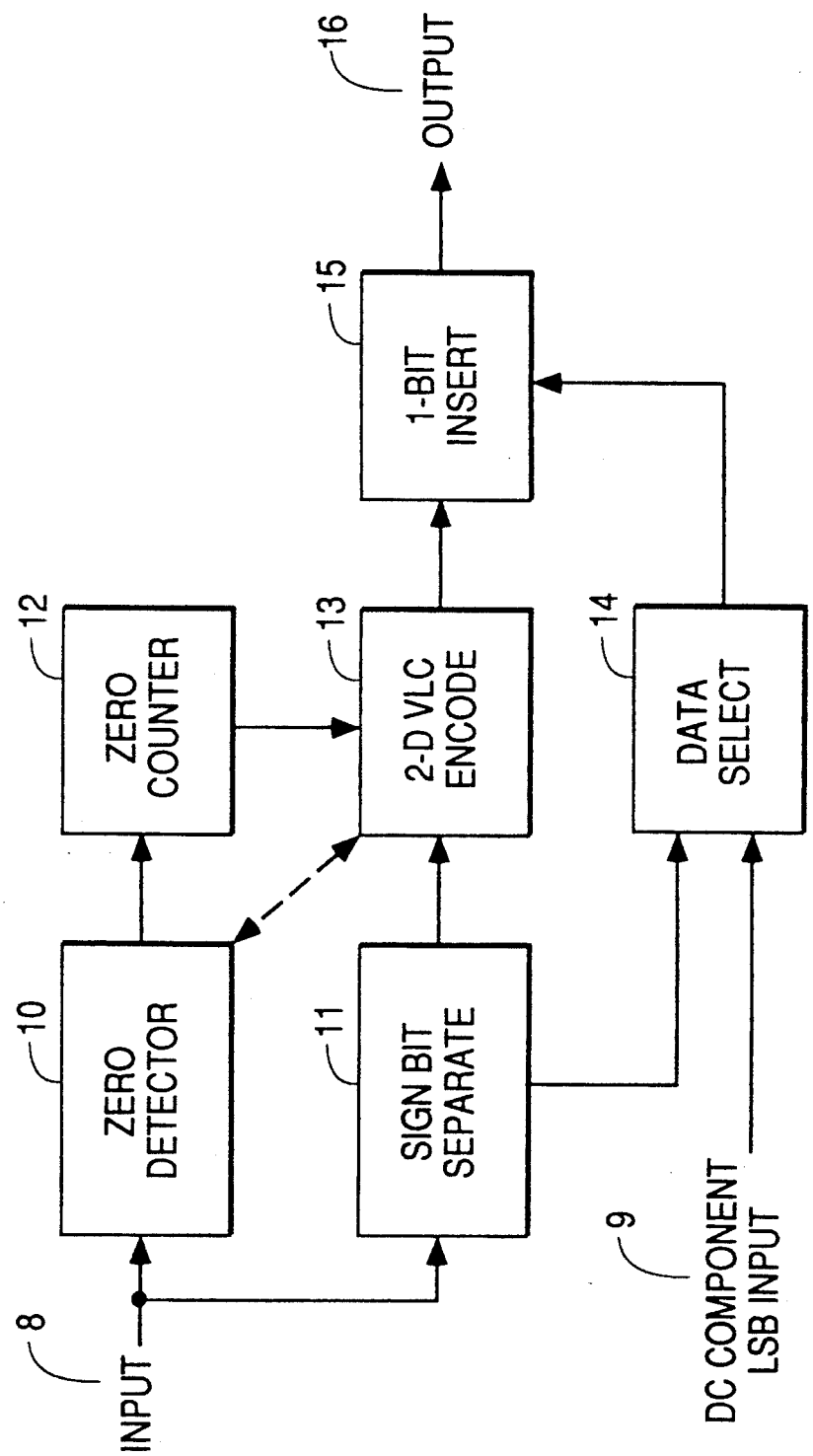
FIG. 2 is a block diagram showing a second embodiment of the present invention.

FIG. 2 is a block diagram showing a second embodiment of the present invention. Shown in FIG. 2 are an input terminal 8 for receipt of orthogonal components of quantized data produced by a DCT procedure, an LSB (least significant bit) input terminal 9 for receipt of an LSB of the DC component produced by the DCT procedure, a zero detector 10, a sign bit separator unit 11, a zero counter 12, a two-dimensional VLC unit 13, a data selector unit 14, a one-bit insertion unit 15, and an output terminal 16.

The action of the second embodiment will be explained. Quantized data fed from the input terminal 8 is transferred to the zero detector 10 where a determination is made as to whether or not its value is zero. If zero, the count is increased 1 with the zero counter 12. If not, the count produced by the zero counter 12 is fed to the two-dimensional VLC unit 13 for resetting to zero. The sign bit separator 11 divides the quantized data into an absolute value and a sign bit for determining the value direction. The absolute value is then transferred to the two-dimensional VLC unit 13 where it is processed with consecutive zeros supplied from the zero counter 12 when the quantized value is determined to be non-zero by the zero detector 10 so as to thus produce a variable length code. At the time, the LSB of a DC component of the data of a DCT block in processing is supplied the LSB input terminal 9 to the data selector 14. If the code word delivered from the two-dimensional VLC unit 13 is an EOB, the data selector 14 transmits the LSB of the DC component of the DCT block to the one-bit insertion unit 15. If not, the sign bit from the sign bit separator 11 is fed to the one-bit insertion unit 15. The one-bit insertion unit 15 assigns one bit selected by the data selector 14 to the lowest bit of the code word delivered from the two-dimensional VLC unit 13. If the code word from the two-dimensional VLC unit 13 contains particular quantized values (e.g. 0) associated with no sign bit and is not an EOB, it will directly be transferred without insertion of a bit.

In this manner, the assignment of an LSB of the DC component to the lowest bit of an EOB will be feasible. The DC component derived from a DCT operation is commonly transmitted in the form of a fixed length code. According to the present invention, an LSB of the DC component is transmitted simultaneously with the EOB while the remaining data of the same being transferred on the fixed region of a code string. As described, the use of a sign bit of the EOB will prevent unwanted declination in the effectiveness of the high-efficiency encoding. Also, the LSB of the DC component produces a negligible part of a reproduced image and even if it is dropped out together with its EOB due a transmission error, no appreciable fault will effect the quality of the image.

Although the foregoing embodiments are explained referring to the discrete cosine transformation, the present invention will be feasible with the use of another high-efficiency encoding technique employing orthogonal transformation or the like. Also, the present invention is not limited to the aforementioned arrangements of components and a variety of constructions will be possible without departing from the scope of the invention. Any type of data can be carried on the EOB. Although a sign bit in the present invention is the lowest bit of each code word, it may be assigned to any bit of the code word in the variable length code encoding.

As set forth above, the present invention allows the lowest bit of an end-of-block code word to carry a piece of data to be transmitted other than the contents of the EOB, whereby declination in the effectiveness of the high-efficiency encoding can be avoided. For example, an LSB of the DC component of a DCT block data is assigned to the lowest bit of the EOB so that effectiveness of the high-efficiency encoding remains unchanged. Even if the LSB of the DC component is accidentally lost together with its EOB data, no appreciable fault will appear on a reproduced image.

What is claimed is:

1. A variable length code encoder comprising:
   a code separating means for separating from an input signal a sign bit which denotes whether a value of the input signal is positive or negative during a process in which video or audio data is divided into blocks and data of each block is converted into a variable length code form for transmission and/or storage; and
   a means for assigning the sign bit separated by said code separating means to a lowest bit of an end-of-block code word having a special bit pattern which does not appear at any other position than the end of each block.

2. A variable length code encoder according to claim 1, wherein the variable length code encoding is such that both a number of continuous zeros of the input signal and an amplitude of non-zeros following the continuous zeros are simultaneously encoded to one or two code words.

3. A variable length code encoder comprising:
   a transforming means for dividing an input signal of video or audio data into blocks and separating a direct-current component from the remaining components of each block;
   a code separating means for separating a sign bit which denotes whether a value of the input signal is positive or negative from the input signal during variable length code encoding of the data in each block for transmission and/or storage; and a means for assigning the sign bit separated by said code separating means to a lowest bit of an end-of-block code word having a special bit pattern which does not appear at any other position than the end of each block whereby the lowest one bit of the end-of-block code word can carry information related to the direct-current component in the block.

4. A variable length code encoder according to claim 3, wherein said transforming means performs orthogonal transformation.

5. A variable length code encoder according to claim 3, wherein the sign bit assigned to the lowest bit of the end-of-block code word is a least significant bit of the direct-current component.

6. A variable length code encoder according to claim 3, wherein the variable length code encoding is such that both a number of continuous zeros of the input signal and an amplitude of non-zeros following the continuous zeros are simultaneously encoded to one or two code words.

* * * * *